(12) United States Patent
Hsieh et al.

(10) Patent No.: US 8,987,842 B2
(45) Date of Patent: Mar. 24, 2015

(54) MICROELECTROMECHANICAL SYSTEM (MEMS) DEVICE AND FABRICATION METHOD THEREOF

(75) Inventors: Tsung-Min Hsieh, New Taipei (TW); Chien-Hsing Lee, Hsinchu County (TW); Jhyy-Cheng Liou, Hsinchu County (TW)

(73) Assignee: Solid State System Co., Ltd., Hsinchu (TW)

( * ) Notice: Subject to any disclaimer, the term of this patent is extended or adjusted under 35 U.S.C. 154(b) by 230 days.

(21) Appl. No.: 13/615,645

(22) Filed: Sep. 14, 2012

(65) Prior Publication Data

US 2014/0077317 A1   Mar. 20, 2014

(51) Int. Cl.
*H01L 29/84* (2006.01)
*B81B 3/00* (2006.01)
*B81B 7/00* (2006.01)
*B81C 1/00* (2006.01)

(52) U.S. Cl.
CPC ... *B81B 3/00* (2013.01); *B81B 7/00* (2013.01); *B81C 1/00* (2013.01)
USPC ............ 257/415; 257/416; 257/E21.002

(58) Field of Classification Search
CPC .............. B81B 3/00; B81B 7/00; B81C 1/00; H01L 29/84
USPC ......... 257/414, 415, 416, 417, 418, 419, 420, 257/E29.324, E21.002
See application file for complete search history.

(56) References Cited

U.S. PATENT DOCUMENTS 8,258,591 B2 * 9/2012 Lee et al. ............... 257/416
2009/0321887 A1 * 12/2009 Larrey et al. ............. 257/618

* cited by examiner

*Primary Examiner* — Cuong Q Nguyen
*Assistant Examiner* — Yosef Gebreyesus
(74) *Attorney, Agent, or Firm* — Jianq Chyun IP Office

(57) ABSTRACT

A MEMS device includes a silicon substrate and a structural dielectric layer. The silicon substrate has a cavity. The structural dielectric layer is disposed on the silicon substrate. The structural dielectric layer has a space above the cavity of the silicon substrate and holds a plurality of structure elements within the space, including: a conductive backplate, over the silicon substrate, having a plurality of venting holes and a plurality of protrusion structures on top of the conductive backplate; and a diaphragm, located above the conductive backplate by a distance, wherein a chamber is formed between the diaphragm and the conductive backplate, and is connected to the cavity of the silicon substrate through the venting holes. A first side of the diaphragm is exposed by the chamber and faces to the protrusion structures of the conductive backplate and a second side of the diaphragm is exposed to an environment space.

19 Claims, 9 Drawing Sheets

MICROELECTROMECHANICAL SYSTEM (MEMS) DEVICE AND FABRICATION METHOD THEREOF

BACKGROUND

1. Field of Invention

The present invention relates to semiconductor fabrication, and more particularly relates to microelectromechanical system (MEMS) device and fabrication method thereof.

2. Description of Related Art

The MEMS device, such as the MEMS microphone, basically includes a backplate and a diaphragm over a silicon substrate. The backplate has venting holes, the silicon substrate has a cavity, so that the cavity is connected to a chamber, which is formed between the backplate and the diaphragm, through the venting holes. The diaphragm can sense the air pressure caused by sound wave, resulting in change of capacitance between the diaphragm and the back plate, accordingly. The detecting voltage signal includes the capacitance effect, thus the sound can be sensed. The performance of MEMS microphone then can be achieved.

However, MEMS device can be formed in various structures, which also cause different performances. How to design a proper MEMS device is still an issue for further development.

SUMMARY OF THE INVENTION

Embodiments of the invention provide MEMS devices, which can avoid sticking phenomenon between the backplate and the diaphragm during fabrication.

An embodiment of the invention provides a MEMS device including a silicon substrate and a structural dielectric layer. The silicon substrate has a cavity. The structural dielectric layer is disposed on the silicon substrate. The structural dielectric layer has a space above the cavity of the silicon substrate and holds a plurality of structure elements within the space, including: a conductive backplate, over the silicon substrate, having a plurality of venting holes and a plurality of protrusion structures on top of the conductive backplate; and a diaphragm, located above the conductive backplate by a distance, wherein a chamber is formed between the diaphragm and the conductive backplate, and is connected to the cavity of the silicon substrate through the venting holes. A first side of the diaphragm is exposed by the chamber and faces to the protrusion structures of the conductive backplate and a second side of the diaphragm is exposed to an environment space.

An embodiment of the invention provides a MEMS device includes a silicon substrate, a structural dielectric layer, and a passivation layer. The silicon substrate has a cavity. The structural dielectric layer is disposed on the silicon substrate. The passivation layer on the structural dielectric layer. The passivation layer has an opening over the cavity of the silicon substrate. The structural dielectric layer has a MEMS space and holds a plurality of structure elements within the MEMS space. The structure elements comprise a first conductive layer disposed over the silicon substrate, wherein the first conductive layer has a plurality of venting holes above the cavity of the silicon substrate. A supporting layer is disposed on the first conductive layer, surrounding the venting holes. A second conductive layer is disposed on the supporting layer. A plurality of protrusion structures is disposed on the second conductive layer within a region above the cavity of the silicon substrate. A cap layer is capping over the first conductive layer, the supporting layer, the second conductive layer and the protrusion structures. A diaphragm is located above the second conductive layer by a distance, wherein a chamber is formed between the diaphragm and the cap protection layer and is connected to the cavity of the silicon substrate through the venting holes. Portions of the diaphragm, the first conductive layer and the cap layer within the MEMS space are exposed.

An embodiment of the invention provides a method for fabricating MEMS device, comprising providing a silicon substrate having a first side and a second side. A structural dielectric layer is formed over the first side of the silicon substrate, wherein a plurality of structure elements is embedded in the structural dielectric layer and to be released. The structure elements comprises: a conductive backplate disposed over the silicon substrate, having a plurality of venting holes and a plurality of protrusion structures on a top of the conductive backplate; and a diaphragm located above the conductive backplate by a distance, wherein a chamber is formed between the diaphragm and the conductive backplate. A cavity is formed in the silicon substrate at the second side, wherein the cavity is corresponding to the structure elements embedded in the structural dielectric layer. An isotropic etching process is performed on a dielectric material of the structural dielectric layer to release the structure elements. A first side of the diaphragm is exposed by the chamber and faces to the protrusion structures of the conductive backplate and a second side of the diaphragm is exposed to an environment space. The chamber is connected to the cavity of the silicon substrate through the venting holes of the conductive backplate.

An embodiment of the invention provides a method for fabricating MEMS device. The method comprises providing a silicon substrate, having a first side and a second side. Then, a structural dielectric layer is formed on the first side of the silicon substrate, wherein a plurality of structure elements is embedded in the structural dielectric layer and to be released. The structure elements comprise a first conductive layer, formed over the silicon substrate, wherein the first conductive layer has a plurality of venting holes; a supporting layer formed on the first conductive layer, surrounding the venting holes; a second conductive layer, formed on the supporting layer; a plurality of protrusion structures, formed on the second conductive layer; a cap layer, capping over the first conductive layer, the supporting layer, the second conductive layer and the protrusion structures; and a diaphragm, formed above the second conductive layer by a distance, wherein a chamber is formed between the diaphragm and the cap protection layer and is connected to the cavity of the silicon substrate through the venting holes. A passivation layer is formed over the structural dielectric layer. The passivation layer has an opening to expose the structural dielectric layer at a MEMS region. A cavity in the silicon substrate at the second side exposes the structural dielectric layer. An isotropic etching process is performed on a dielectric material of the structural dielectric layer to release the structure elements. A first side of the diaphragm is exposed by the chamber and faces to the protrusion structures of the conductive backplate and a second side of the diaphragm is exposed to an environment space. The chamber is connected to the cavity of the silicon substrate through the venting holes of the conductive backplate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

In the invention, a MEMS device is proposed. The structure of the MEMS includes a protrusion on the back plate toward the diaphragm of the MEMS device. The protrusion is to avoid sticking between the backplate and the diaphragm when isotropic etching, such as wet etching, is performed. When the isotropic etching process accomplishes, the etchant needs to be drained out from the chamber between the diaphragm and the backplate. The mechanical strength of the diaphragm with required sensibility to air pressure, usually is not so strong and then may stick onto the backplate when etchant is drained out. The protrusion, serving as anti-sticking protrusion, can avoid the diaphragm to stick with the backplate.

Several embodiments are provided for describing the invention. However, the invention is not limited to the provided embodiments.

Figure 1:
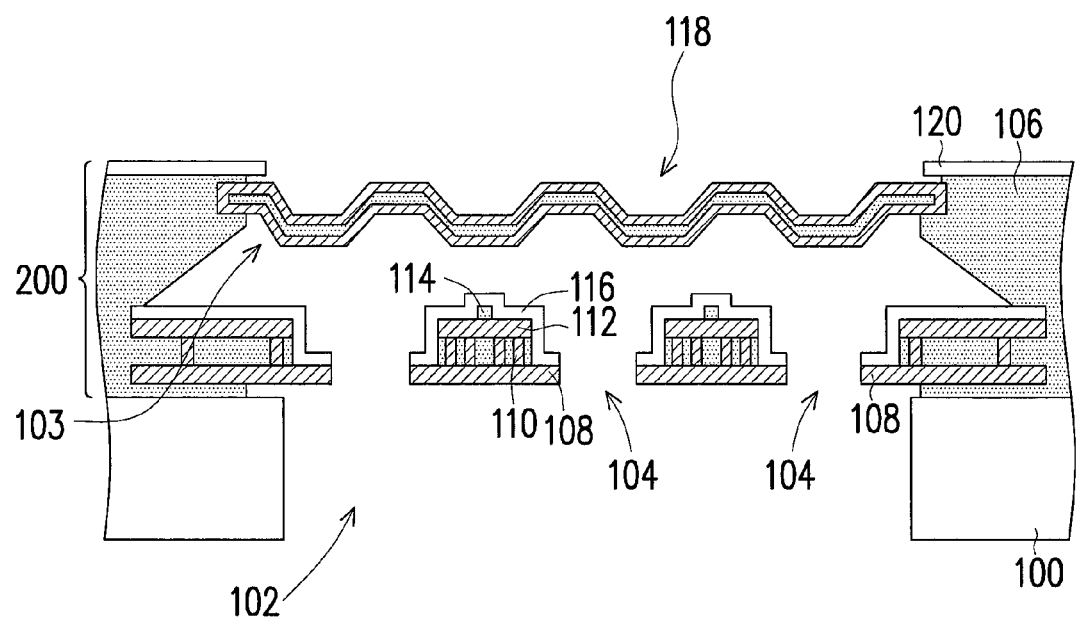
FIG. 1 is a cross-sectional view, schematically illustrating a MEMS device, according to an embodiment of the invention.

FIG. 1 is a cross-sectional view, schematically illustrating a MEMS device, according to an embodiment of the invention. In FIG. 1, the MEMS device includes a silicon substrate 100 and a structural dielectric layer 200. The silicon substrate 100 has a cavity 102. The structural dielectric layer 200 is disposed on the silicon substrate 100. The structural dielectric layer 200 is a dielectric layer 106 embedded with several structure elements. The structural dielectric layer 200 at the final stage, but not the last stage, has a free space above the cavity 102 of the silicon substrate 100 corresponding to the cavity 103 and holds the structure elements within the space. The structure elements include a conductive backplate and a diaphragm 118. The conductive backplate may include a conductive layer 108, disposed over the silicon substrate 100. The backplate has a plurality of venting holes 104 and a plurality of protrusion structures 114 on top of the conductive backplate.

Figure 2A:
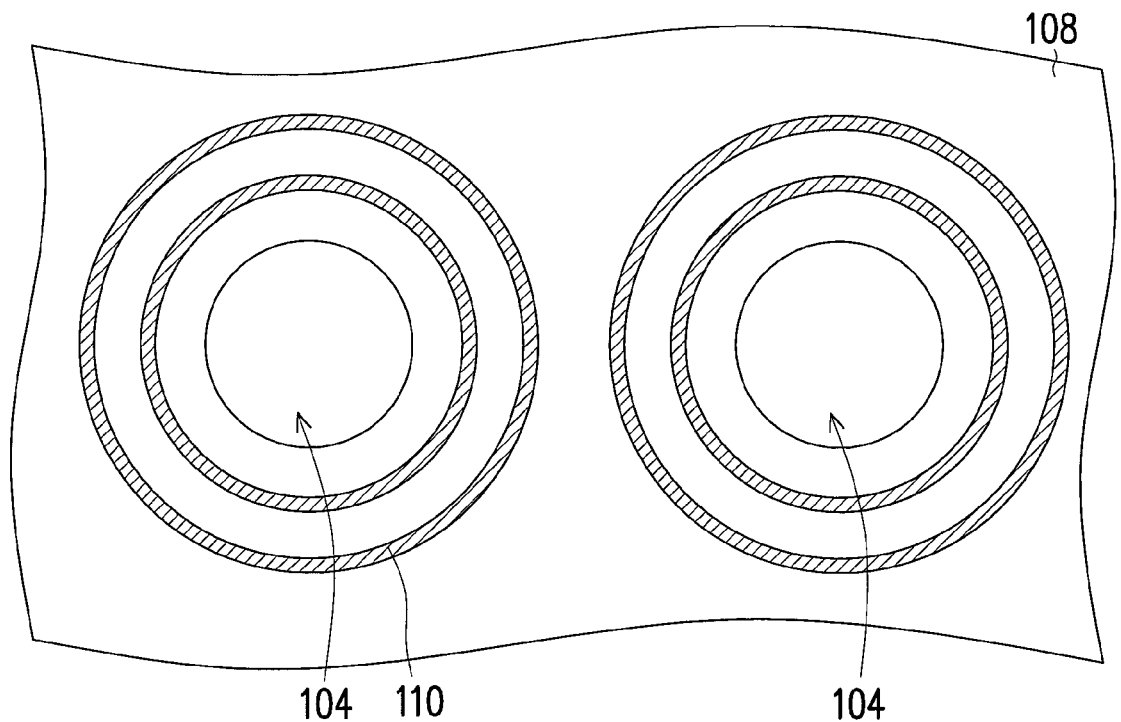
FIGS. 2A-2B are top views, schematically illustrating a portion of structure of the backplate, according to an embodiment of the invention.
Figure 2B:
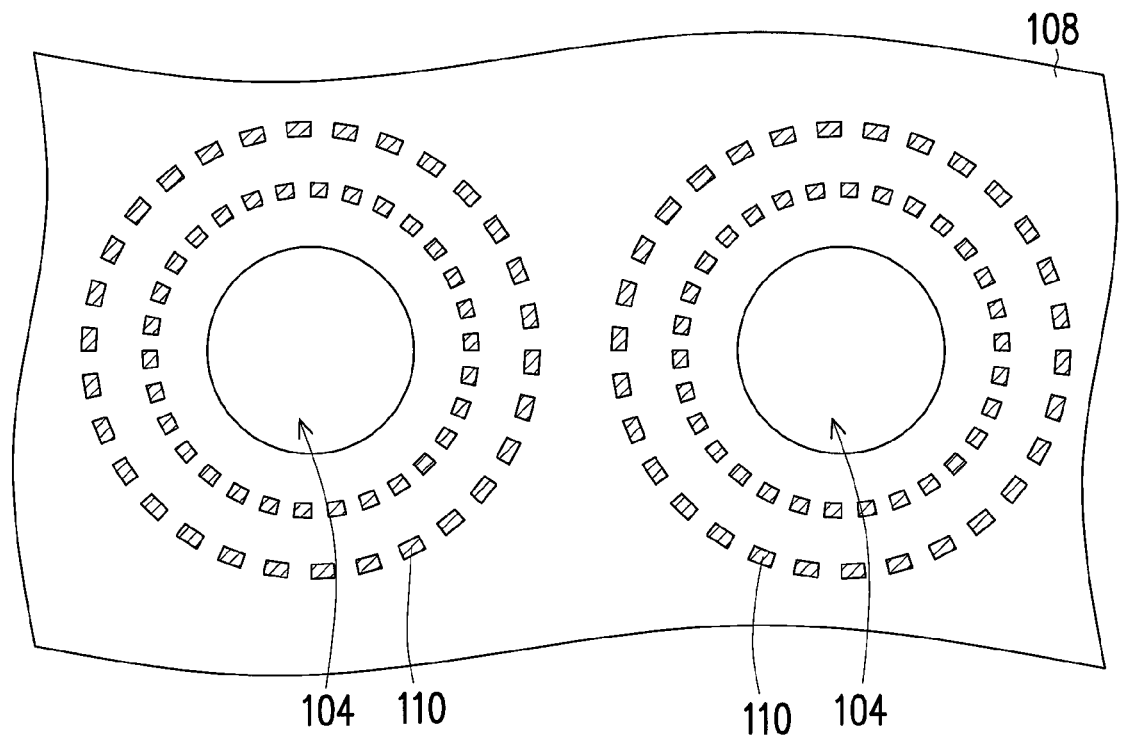

The conductive backplate can further include the supporting layers 110, the conductive layer 112, and the cap layer 116. FIGS. 2A-2B are top views, schematically illustrating a portion of structure of the backplate, according to an embodiment of the invention. Also referring to FIG. 2A or FIG. 2B, the supporting layer 110 can be multiple rings surrounding the venting holes 104 as shown in FIG. 2A or multiple supporting structure units, distributed around the venting holes 104 as shown in FIG. 2B. It should be noted that the geometric shape of the venting holes 104 is not limited to circle. The geometric shape of the venting holes 104 can also be square or any other proper shape for venting function for the MEMS device. Another conductive layer 112 can also be formed on the supporting layer 110. A plurality of protrusions 116 can be form on top of the backplate. In an example, the protrusion structures 116 are formed on the conductive layer 112. The cap layer 112 then caps over the protrusion structures 116, the conductive layer 112, the supporting layer 110 and the conductive layer 108. There is dielectric material is filled between conductive layer 108, supporting layer 110, conductive layer 112, and cap layer 116. Since the cap layer, serving as a protection layer, caps a portion of the dielectric material, as to be described in fabrication process, the dielectric material can remain without being etched by the isotropic etching process to release the backplate and the diaphragm. The cap layer can be single layer or composited multiple layers. The material of the cap layer can be TiN, Al, polysilicon or other like materials. The etching rate of the cap layer generally is lower than the dielectric material of the structural dielectric layer 200 to have the protection effect. It can also be known in the art that the backplate may also include a portion of the silicon substrate 100.

The diaphragm 118 is located above the conductive backplate or the conductive layer 108, by a distance. A chamber 103 is then formed between the diaphragm 118 and the conductive backplate. The chamber 103 is connected to the cavity 103 of the silicon substrate 100 through the venting holes 104. A first side of the diaphragm 118 is exposed by the chamber 103 and faces to the protrusion structures 114 of the conductive backplate and a second side of the diaphragm 118 is exposed to an environment space.

The structure of the diaphragm 118 can be flat or in corrugated structure. In the embodiment, the diaphragm 118 is in corrugated structure. In addition as an example, the diaphragm 118 has the lower conductive layer and an upper conductive layer. A dielectric portion of the dielectric layer 106 is wrapped between the lower and upper conductive layer.

The structural dielectric layer 200 may also includes a passivation layer 120 on the dielectric layer 106 with an opening corresponding to the diaphragm. The passivation layer in etching rate is lower than the dielectric 106 of the structural dielectric layer 200, so that the isotropic etching process at the later stage can just release the central portion of the diaphragm 118, of which the end portion is still embedded and held in the dielectric layer 106.

As known in semiconductor fabrication, the dielectric layer 106 actually includes multiple layers, which are associating with the processes to form the structure elements. The detail in descriptions is omitted.

Figure 3:
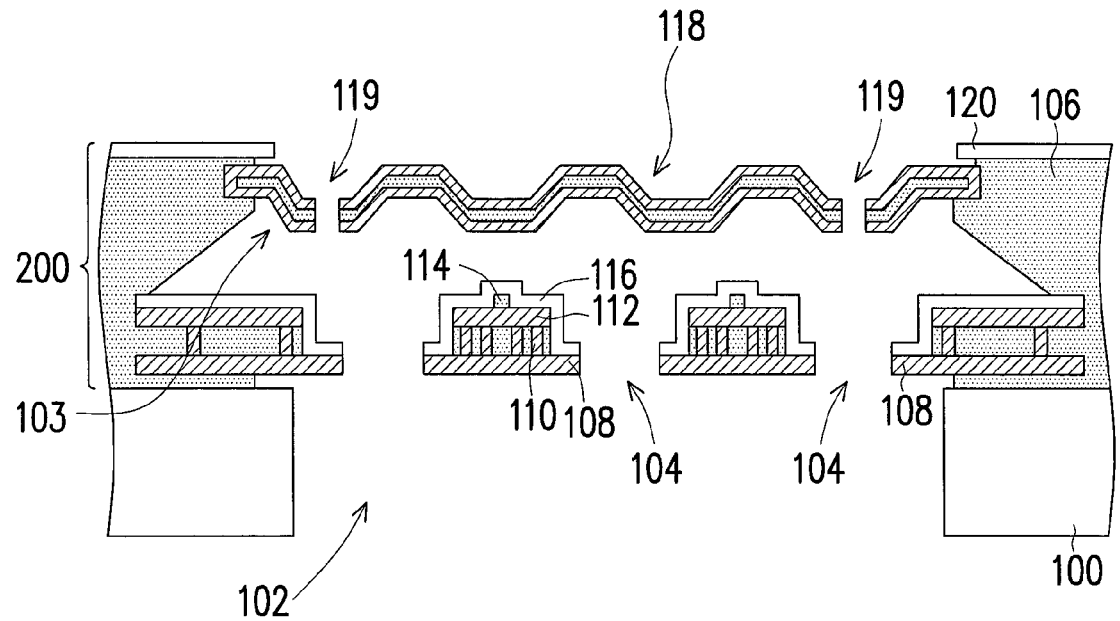
FIG. 3 is a cross-sectional view, schematically illustrating a MEMS device, according to an embodiment of the invention.

FIG. 3 is a cross-sectional view, schematically illustrating a MEMS device, according to an embodiment of the invention. In FIG. 3, the structure of MEMS device is similar to the structure of MEMS device in FIG. 1. The difference is that the diaphragm 118 has additional opening 119 at the peripheral region. The opening 119 can release the tension of the diaphragm and also allows the chamber 103 to have little connection degree to the environmental space.

Figure 4:
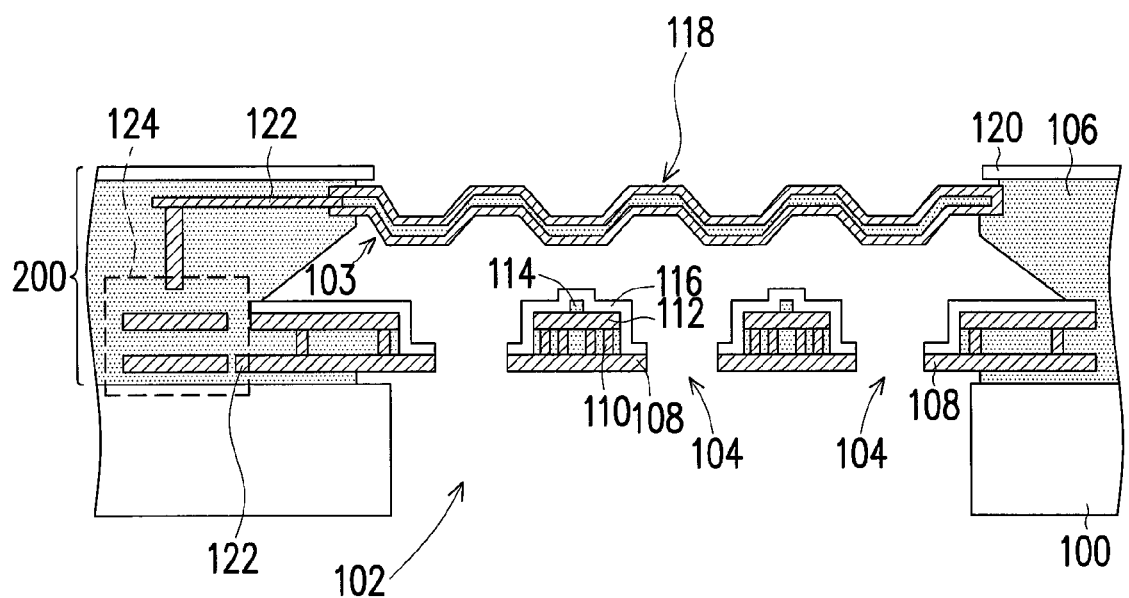
FIG. 4 is a cross-sectional view, schematically illustrating a MEMS device, according to an embodiment of the invention.

FIG. 4 is a cross-sectional view, schematically illustrating a MEMS device, according to an embodiment of the invention. In FIG. 4, the MEMS device is connected to the CMOS circuit 124 by the coupling structure 122. Actually, the MEMS device and the CMOS circuit can be formed on the same silicon substrate 100 under CMOS fabrication process. The CMOS circuit 124 can, for example, detect the variance of the capacitance between the diaphragm 118 and the backplate corresponding to acoustic air pressure.

Figure 5:
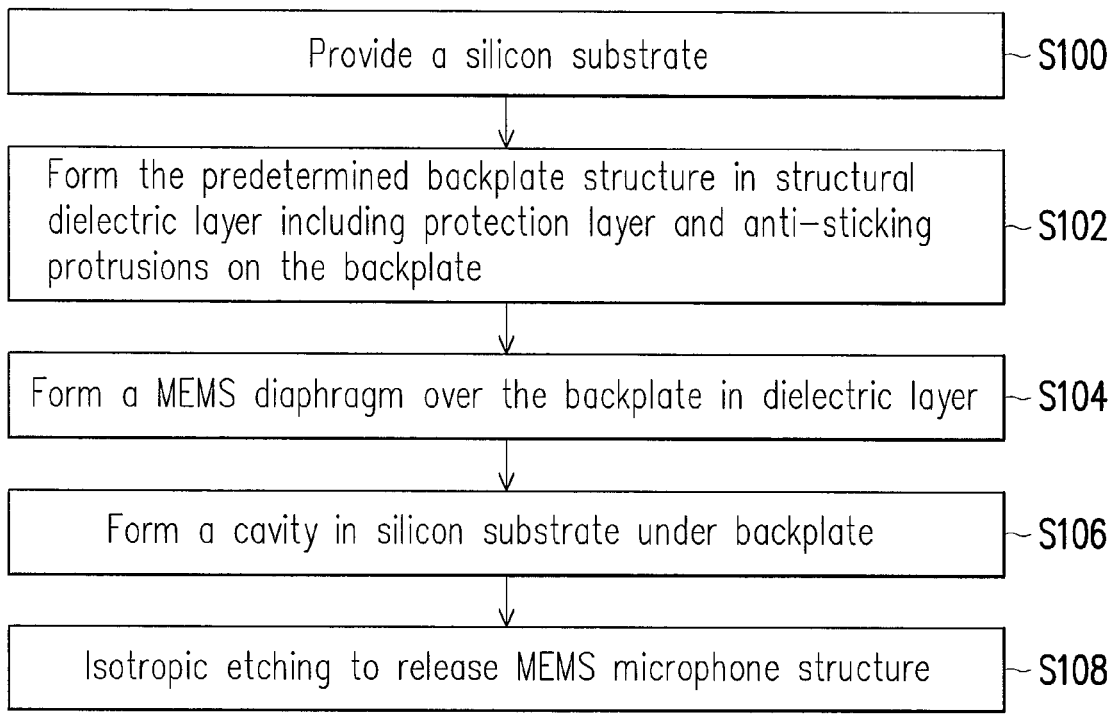
FIG. 5 is a fabrication flow chart, schematically illustrating a method for fabricating a MEMS device, according to an embodiment of the invention.

FIG. 5 is a fabrication flow chart, schematically illustrating a method for fabricating a MEMS device, according to an embodiment of the invention. Generally, the MEMS device can be formed by several steps. In step S100, a silicon substrate is provided. In step S102, a structural dielectric layer with the predetermined backplate structure embedded therein is formed on the silicon substrate. In step S104, a MEMS diaphragm is formed in the structural dielectric layer, over the backplate by a distance. In step S106, the silicon substrate is patterned to form a cavity under the backplate. In step S108, an isotropic etching process is performed to etch dielectric material of the structural dielectric layer and then release the MEMS device, such as the MEMS microphone structure, in which the MEMS diaphragm and the backplate are released and exposed to the environmental space.

Figure 6:
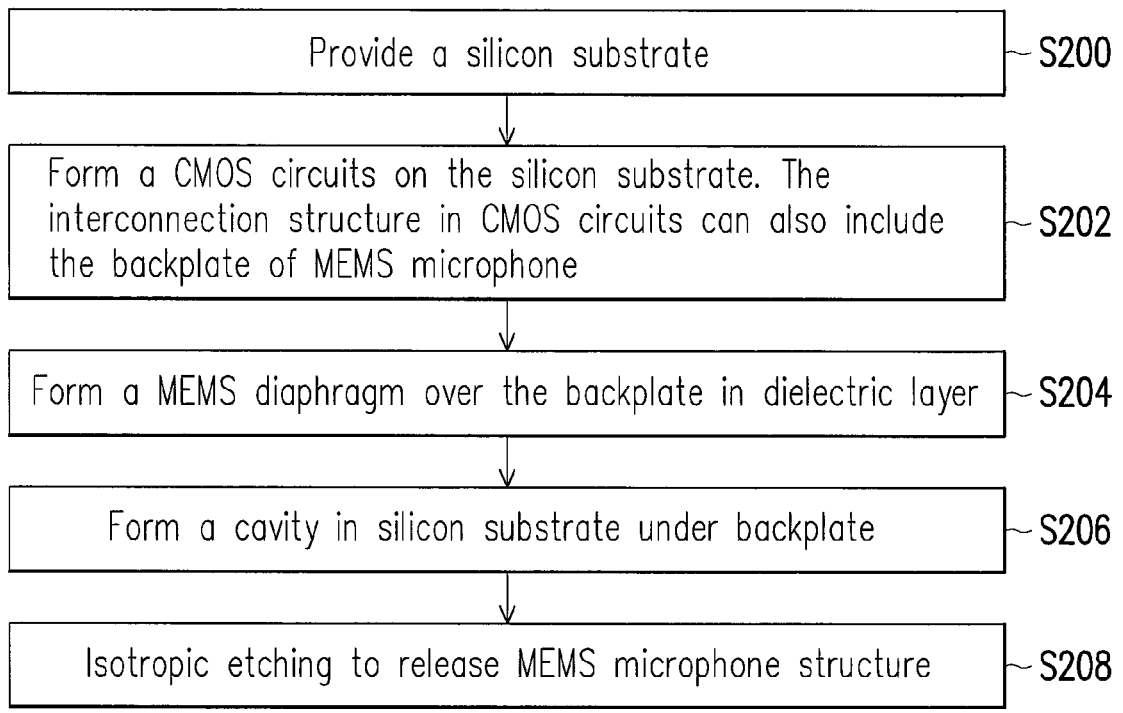
FIG. 6 is a fabrication flow chart, schematically illustrating a method for fabricating a MEMS device with the CMOS circuit, according to an embodiment of the invention.

FIG. 6 is a fabrication flow chart, schematically illustrating a method for fabricating a MEMS device with CMOS circuit as a MEMS microphone, according to an embodiment of the invention. In step S200, a silicon substrate is provided. In step S202, a CMOS circuit is formed in a structural dielectric layer on the silicon substrate. In the same CMOS process, the predetermined backplate structure embedded in the structural dielectric layer is also formed on the silicon substrate. In step S204, a MEMS diaphragm is formed in the structural dielectric layer, over the backplate by a distance. In step S206, the silicon substrate is patterned to form a cavity under the backplate. In step S208, an isotropic etching process is performed to etch dielectric material of the structural dielectric layer and then release the MEMS device, such as the MEMS microphone structure, in which the MEMS diaphragm and the backplate are released and exposed to the environmental space.

Figure 7A:
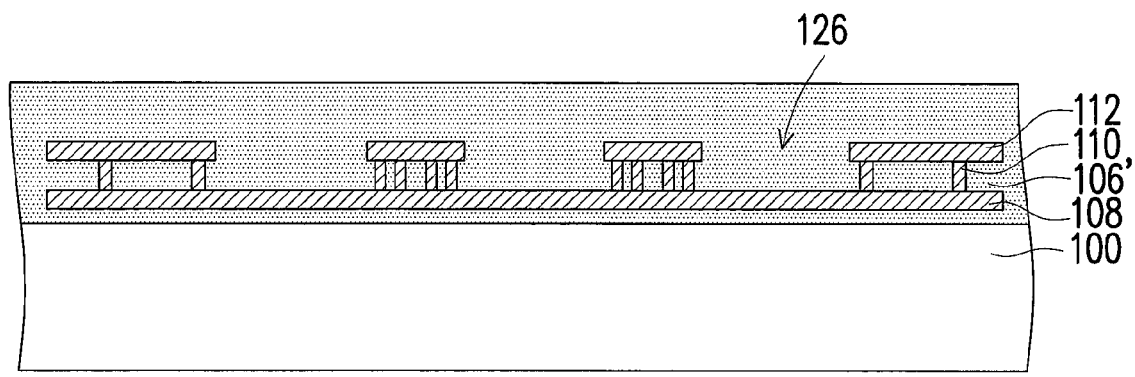
FIGS. 7A-13 are cross-sectional views, schematically the processing steps of a method for fabricating a MEMS device, according to an embodiment of the invention.

FIGS. 7A-13 are cross-sectional views, schematically the processing steps of a method for fabricating a MEMS device, according to an embodiment of the invention. In the following embodiments, the semiconductor fabrication processes to form the MEMS device are described in better detail. In FIG. 7A, a silicon substrate 100 is provided. A structural dielectric layer 106' is formed on the silicon substrate 100. Several structure elements are embedded in the structural dielectric layer 106', which has the dielectric material as a composite layer from multiple sub dielectric layers. The structure elements include, for example, the conductive layer 108, the supporting layers 110 and the conductive layer 112. The conductive layer 112 has openings 126 corresponding to the locations of the venting holes 104 to be form later as shown in FIG. 1. The supporting layers 110 as shown in FIGS. 2A-2B can be rings or multiple supporting units to surround the venting hole 104 and therefore surrounding the opening 126. There is a dielectric portion of the structural dielectric layer 106' filled between the supporting layers 110, the conductive layer 108 and the conductive layer 112. In the example, the conductive layer 108 at this stage is a flat layer without opening. Alternatively in FIG. 7B, the conductive layer 108 can have openings 128 already formed. The openings 128 are also corresponding to the intended venting holes 104 or the openings 126, in which the venting hole 104 is to be formed at later stage.

Figure 8A:
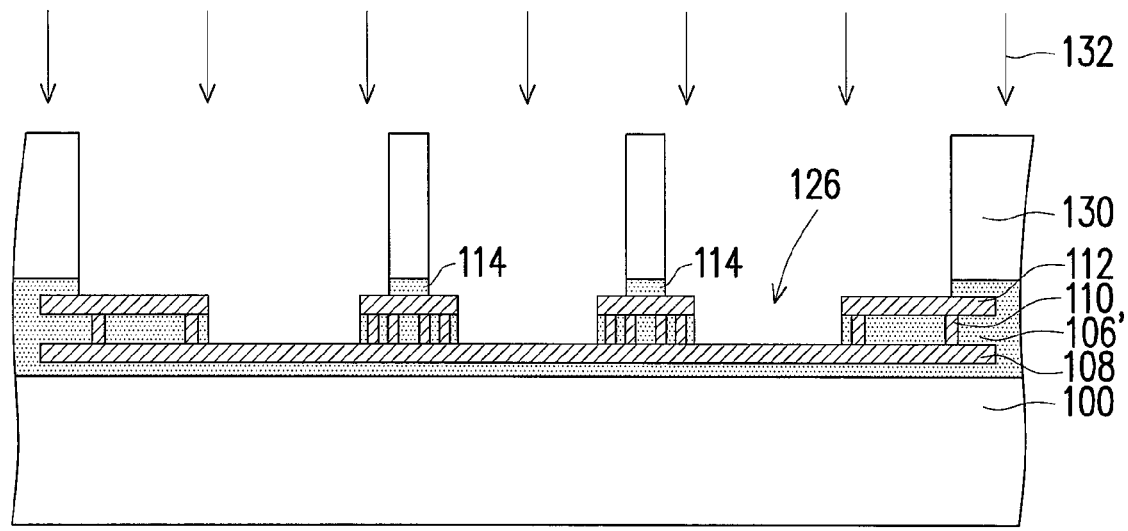

In FIG. 8A, subsequent from FIG. 7A, the photolithographic and etching processes are performed. To remove a portion of dielectric of the structural dielectric layer 106'. The photolithographic and etching processes include forming the photoresistor layer 130 with an opening on the structural dielectric layer 106' to expose structural dielectric layer 106' at the region including the opening 126. An anisotropic etching process 132 is performed by using the photoresistor layer 130 as the etching mask, to etch dielectric material. Then, the conductive layer 112 and the conductive layer 108 are exposed at the region corresponding to the openings of the photoresistor layer 130. It should be noted that a residual portion of dielectric of the structural dielectric layer 106' on the conductive layer 112 is serving as the protrusion structure 114.

Figure 7B:
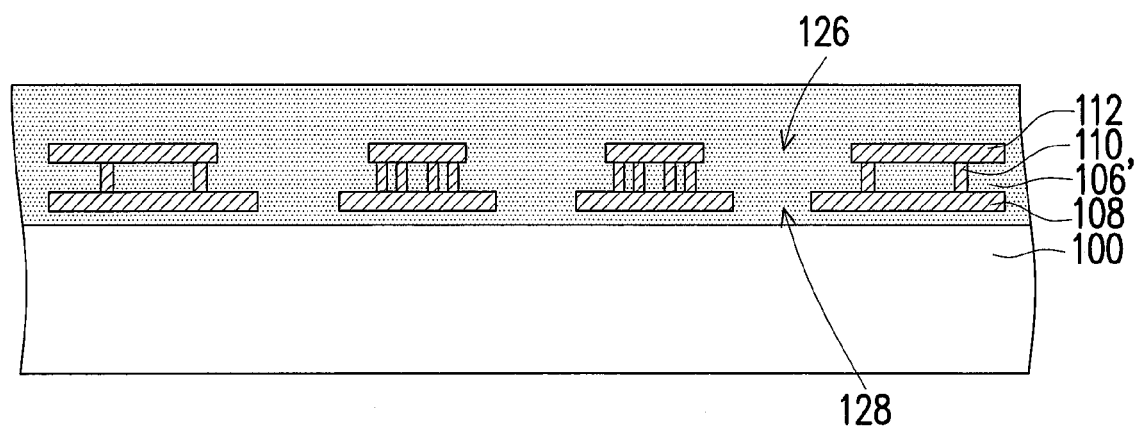
Figure 8B:
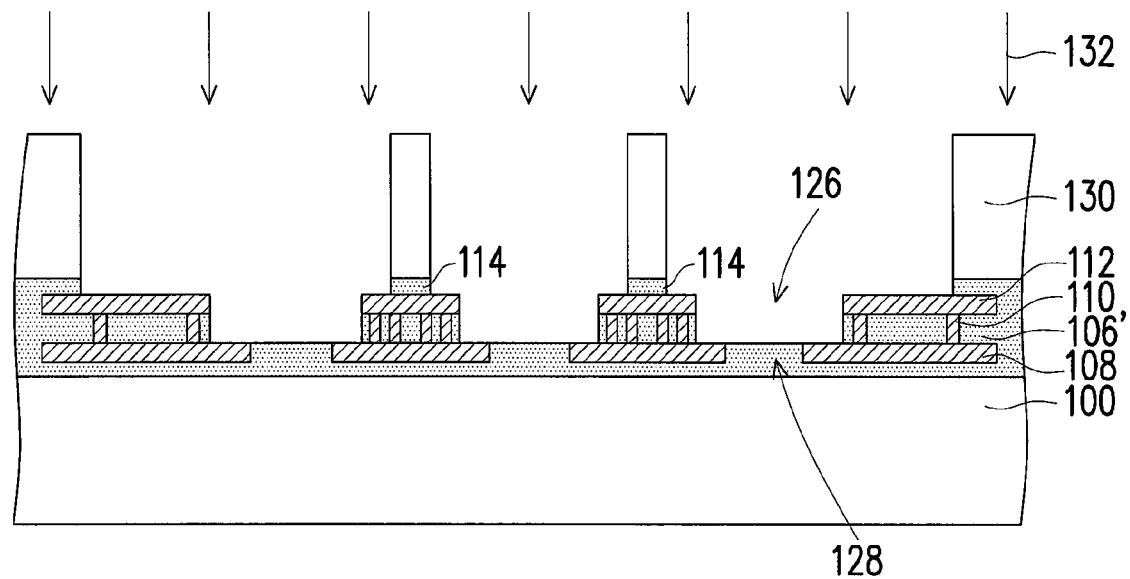

Alternatively in FIG. 8B, subsequent from FIG. 7B, the same processes in FIG. 8A are performed. Since the conductive layer 108 has already had the openings 128, the dielectric within the openings 128 may or may not be etched. In the example, the dielectric within the opening 128 still remains.

Figure 9:
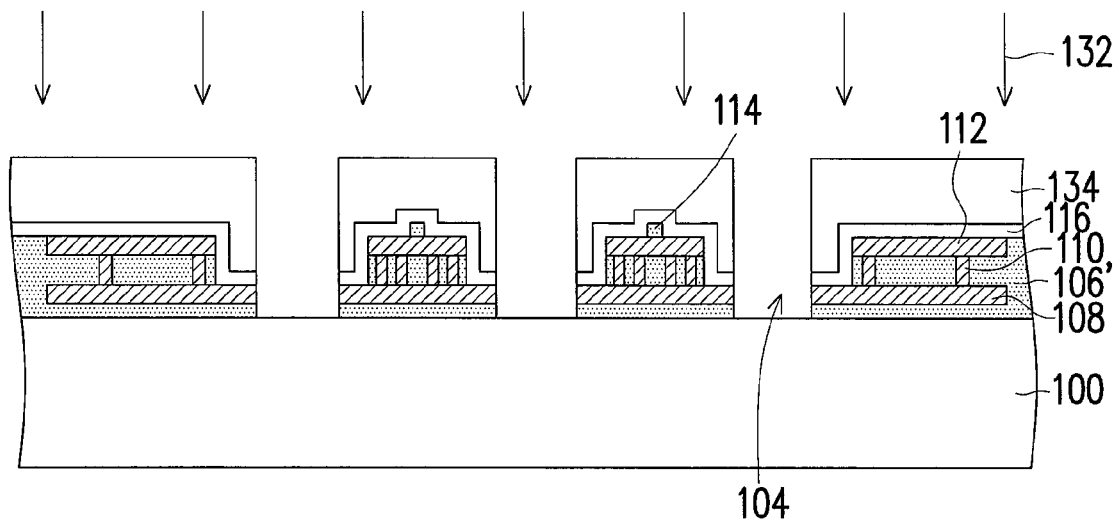

In FIG. 9, after remove the photoresistor layer 130, a cap layer 116 can be formed over the silicon substrate 100. Other photolithographic and etching processes are performed, including forming the photoresistor layer 134 with openings corresponding to the venting hole to be formed later. The cap layer 116 covers the protrusion structure 114 and also serving the sidewall to seal a portion of dielectric between the conductive layer 108, the cap layer 116, the supporting layer 110, and the conductive layer 112. Then, an anisotropic etching process 136 is performed to etch the cap layer 116, the conductive layer 108 and the structural dielectric layer 106', using the photoresistor layer 134 as the etching mask, to expose the silicon substrate 100. The venting holes 104 to be form later are formed.

Figure 10:
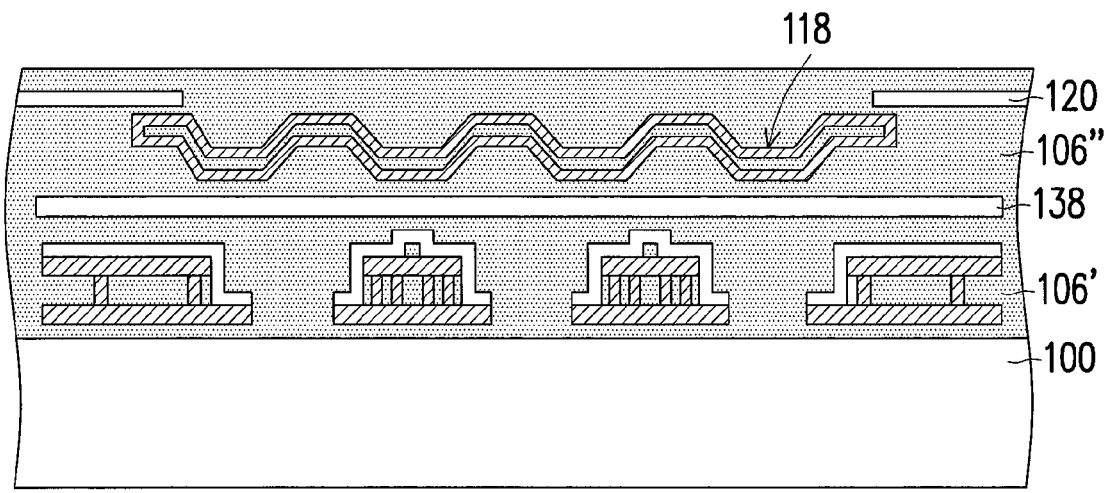

In FIG. 10, another structural dielectric layer 106" is further formed over the silicon substrate 100 to combine with the structural dielectric layer 106' as the structural dielectric layer 200, as shown in FIG. 1. Here, a dielectric layer 138 with higher etching rate than the etching rate of the dielectric material of the structural dielectric layers 106', 106" may be formed inside. The dielectric layer 138 can be phospho silicate glass (PSG) or boro-phospho silicate glass (BPSG). The dielectric layer 138 allows a fast etching when the isotropic etching process is perform later to release the MEMS device. A diaphragm 118 as previously described is embedded in the structural dielectric layer 106". A passivation layer 120 with an opening is also formed over the diaphragm 118, in which the opening is corresponding to the diaphragm 118. The diaphragm 118 may be a corrugated structure and has a low conductive layer and an upper conductive layer to enclose a dielectric portion.

Here as can be understood, if the small openings 119 in FIG. 3 are intended, the diaphragm 118 can accordingly formed with additional steps.

Figure 11:
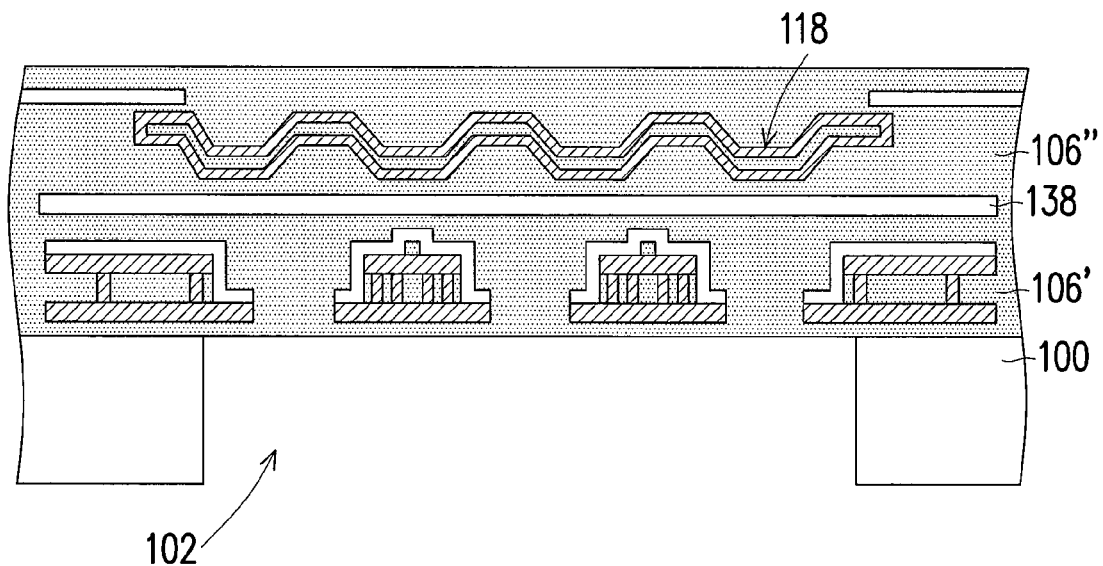
Figure 12:
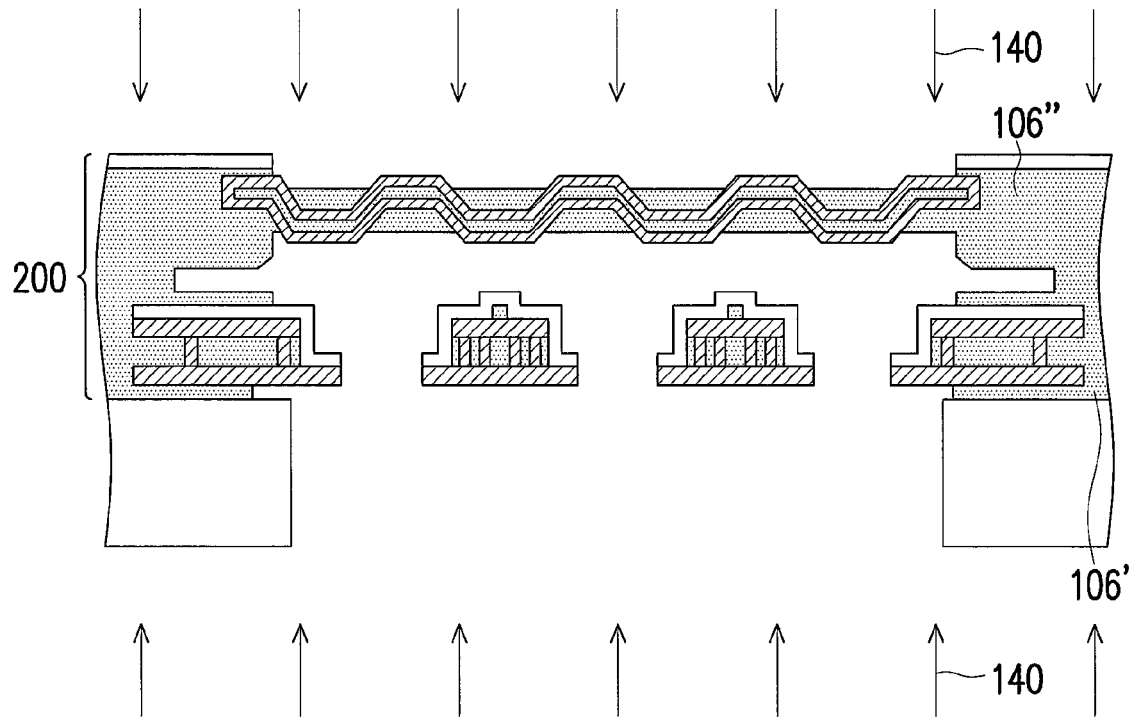

In FIG. 11, the silicon substrate 100 is patterned to form the cavity 102 to expose the structural dielectric layer 106'. In FIG. 12, an isotropic etching process 140 is performed to etch the exposed portion of dielectric material in the structural dielectric layer 200. Usually, the dielectric portion under the diaphragm 118 is more than the dielectric portion above the diaphragm 118 and may take longer time to etch the dielectric. If the etching time is too long, the structure elements may be damaged by etching also. However, the dielectric layer 138 with faster etching rate can reduce the etching time.

Figure 13:
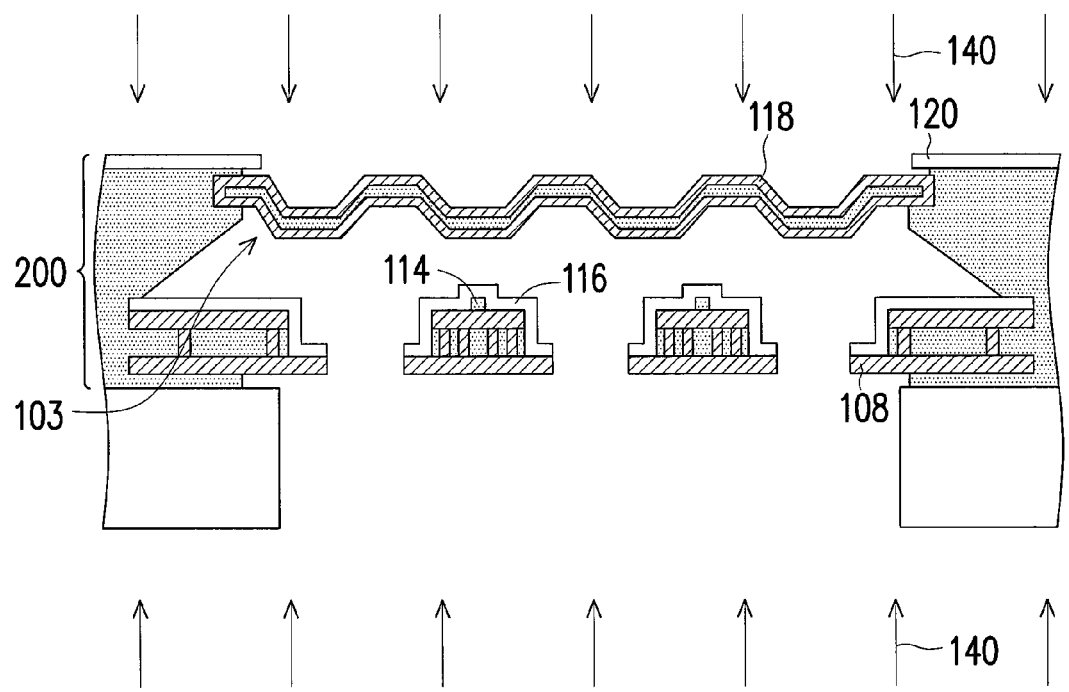

In FIG. 13, the isotropic etching process 140 is then releasing the backplate and the diaphragm 118. The protrusion structure 114 and a portion of dielectric of the backplate are capped by the cap layer 116 and therefore are not etched away. The mechanical strength of the diaphragm 118 is not so strong. When the isotropic etching process finishes and etchant is drained out from the camber 103, the diaphragm 118 may be pulled to stick onto the backplate. If the contact area is too large, the diaphragm 118 cannot return back to the original position. However, the protrusion structure 114 can stop the diaphragm 118 with small contact area when the etchant is drained out from the chamber 103. This protrusion structure 114 would allow the diaphragm 118 to return back to the original position. The passivation layer 120 with the low etching rate can preserve dielectric material at the peripheral portion of the diaphragm 118 to hold the diaphragm 118.

The fabrication of CMOS circuit is not described. However, the CMOS circuit and MEMS device can be fabricated, simultaneously, based on the compatible semiconductor fabrication processes.

The invention has proposed the protrusion structure 114 on top of the backplate to avoid the diaphragm 118 to stick onto backplate. In addition, the cap layer can protect the backplate when the isotropic etching process at the stage to release the MEMS device.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A microelectromechanical system (MEMS) device, comprising:
    a silicon substrate, having a cavity; and
    a structural dielectric layer, disposed on the silicon substrate, wherein the structural dielectric layer has a space above the cavity of the silicon substrate and holds a plurality of structure elements within the space, comprising:
        a conductive backplate, over the silicon substrate, having a plurality of venting holes and a plurality of protrusion structures on top of the conductive backplate; and
        a diaphragm, located above the conductive backplate by a distance, wherein a chamber is formed between the diaphragm and the conductive backplate, and is connected to the cavity of the silicon substrate through the venting holes,
    wherein a first side of the diaphragm is exposed by the chamber and faces to the protrusion structures of the conductive backplate and a second side of the diaphragm is exposed to an environment space.

2. The MEMS device of claim 1, wherein the diaphragm comprises a first layer and a second layer and a portion of the structural dielectric layer enclosed between the first layer and a second layer.

3. The MEMS device of claim 2, wherein the first layer and the second layer enclosing the structural dielectric layer are conductive.

4. The MEMS device of claim 1, wherein the diaphragm is a corrugated structure.

5. The MEMS device of claim 1, wherein the diaphragm also has at least an opening, for connecting the chamber to the environment space.

6. The MEMS device of claim 1, wherein the conductive backplate comprises parallel multilevel conductive layers and a dielectric layer filled between the conductive layers.

7. The MEMS device of claim 6, further comprising a capping layer on the conductive backplate layer to cover a sidewall of the conductive backplate, wherein the capping layer has an etching rate lower than an etching rate of the dielectric layer.

8. The MEMS device of claim 1, wherein the conductive backplate comprises parallel multilevel conductive layers, a vertical conductive layer vertical to the conductive layers, and a dielectric layer filled between the parallel multilevel conductive layers and the vertical conductive layer.

9. The MEMS device of claim 8, further comprising a capping layer on the conductive backplate layer to cover a sidewall of the conductive backplate layer, wherein the capping layer has an etching rate lower than an etching rate of the dielectric layer.

10. The MEMS device of claim 1, further comprising a passivation layer on top of the structural dielectric layer, the passivation layer has an opening to expose the second side of the diaphragm and is lower in etching rate than the structural dielectric layer.

11. A microelectromechanical system (MEMS) device, comprising:
    a silicon substrate, having a cavity;
    a structural dielectric layer, disposed on the silicon substrate; and
    a passivation layer on the structural dielectric layer, the passivation layer has an opening over the cavity of the silicon substrate,
    wherein the structural dielectric layer has a MEMS space and holds a plurality of structure elements within the MEMS space, comprises:
        a first conductive layer, disposed over the silicon substrate, wherein the first conductive layer has a plurality of venting holes above the cavity of the silicon substrate;
        a supporting layer, disposed on the first conductive layer, surrounding the venting holes;
        a second conductive layer, disposed on the supporting layer;
        a plurality of protrusion structures, disposed on the second conductive layer within a region above the cavity of the silicon substrate;
        a cap layer, capping over the first conductive layer, the supporting layer, the second conductive layer and the protrusion structures; and
        a diaphragm, located above the second conductive layer by a distance, wherein a chamber is formed between the diaphragm and the cap protection layer and is connected to the cavity of the silicon substrate through the venting holes,
    wherein portions of the diaphragm, the first conductive layer and the cap layer within the MEMS space are exposed.

12. The MEMS device of claim 11, wherein the diaphragm comprises a first layer and a second layer and a portion of the structural dielectric layer enclosed between the first layer and a second layer.

13. The MEMS device of claim 11, wherein the diaphragm also has at least an opening, for connecting the chamber to the environment space.

14. The MEMS device of claim 11, wherein the passivation layer is lower in etching rate than a dielectric material of the structural dielectric layer.

15. The MEMS device of claim 11, wherein the supporting layer includes a plurality of ring layers, and each of the venting holes is surrounded by at least one of the ring layers.

16. The MEMS device of claim 11, wherein the supporting layer includes a plurality of supporting structure units, distributed around the venting holes.

17. The MEMS device of claim 11, wherein a portion of the structural dielectric layer fills an inner space enclosed between the cap layer, the first conductive layer, and the second conductive layer.

18. The MEMS device of claim 11, wherein the cap layer is lower in etching rate than a dielectric material of the structural dielectric layer.

19. The MEMS device of claim 11, where the diaphragm is a corrugated structure.

* * * * *